US005847613A

United States Patent [19]

Langlet et al.

[11] Patent Number: 5,847,613

[45] Date of Patent: Dec. 8, 1998

[54] COMPENSATION OF LONG TERM OSCILLATOR DRIFT USING SIGNALS FROM DISTANT HYDROGEN CLOUDS

[75] Inventors: Carl Erik Joakim Langlet; Nils Bertil Norén, both of Stockholm, Sweden

[73] Assignee: Telefonaktiebolaget LM Ericsson, Stockholm, Sweden

[21] Appl. No.: 877,873

[22] Filed: Jun. 18, 1997

Related U.S. Application Data

[60] Provisional application No. 60/020,127, Jun. 20, 1996.

[51] Int. Cl.[6] .......... H03L 7/26

[52] U.S. Cl. .......... 331/3; 331/19; 331/94.1

[58] Field of Search .......... 331/3, 94.1, 18, 331/19

[56] References Cited

U.S. PATENT DOCUMENTS

| | | | |
|---|---|---|---|
| 3,386,049 | 5/1968 | Rorden | 331/2 |
| 3,402,362 | 9/1968 | Rorden | 331/2 |
| 3,792,368 | 2/1974 | Audoin | 331/3 |
| 4,122,408 | 10/1978 | Walls | 331/3 |
| 4,499,433 | 2/1985 | Garvey | 331/94.1 |
| 5,629,649 | 5/1997 | Ujiie | 331/18 |

OTHER PUBLICATIONS

Alekseev, V.A., et al., "Synchronization of Time Scales at the Points Used in Radio Interferometry with Ultralong Bases (RULB) from Observations of Maser Sources of Cosmic Radio Emission", Radiopys Quantum Electron, vol. 18, No. 12, Dec. 1975, pp. 1315–1321.

Taylor, Jr., Joseph H., "Millisecond Pulsars: Nature's Most Stable Clocks", Proceedings of the IEEE, vol. 79, No. 7, Jul. 1, 1991, pp. 1054–1062.

Gaigerov, B.A., et al., "Automatic Frequency Tuning Circuits of Passive Hydrogen Frequency Standards", Measurement Techniques, vol. 34, No. 7, Jul. 1, 1991, pp. 682–685.

Clark, Thomas A., et al., "Synchronization of Clocks by Very–Long–Baseline Interferometry", IEEE Transactions on Instrumentation and Measurement, vol. IM–28, No. 3, Sep. 3, 1979, pp. 184–187.

*Primary Examiner*—Siegfried H. Grimm

*Attorney, Agent, or Firm*—Burns, Doane, Swecker & Mathis, L.L.P.

[57] ABSTRACT

A method and apparatus for compensating for the long term drift of an oscillator. Signals from hydrogen clouds are received and processed to generate an adjustment signal, which is used to adjust the frequency of the oscillator. The adjustment signal is derived from a frequency spectrum midpoint estimated from the signal strength of the received signals.

11 Claims, 3 Drawing Sheets

COMPENSATION OF LONG TERM OSCILLATOR DRIFT USING SIGNALS FROM DISTANT HYDROGEN CLOUDS

This application claims the benefit of U.S. Provisional Application No. 60/020,127, filed Jun. 20, 1996.

FIELD OF THE DISCLOSURE

The present invention relates to a method and apparatus for adjusting for long term drift of the reference frequency of reference oscillators, and more particularly to the adjustment of long term drift of reference oscillators in radio base stations.

BACKGROUND OF THE DISCLOSURE

Most frequency sources, such as crystal oscillators, are subject to frequency drift. This drift can be caused by a number of effects, such as aging or temperature variation in the environment in which the frequency source is located. The drift of a reference frequency can be a particular problem in base stations in radio communications systems since each base station uses a reference frequency signal in the transmission and the reception of signals. Several methods have been suggested for compensating for the frequency drift of frequency sources.

One such method is to include Rubidium, Cesium or Hydrogen Maser clocks in the base stations. An atomic clock or frequency standard utilizing a source of atomic hydrogen in conjunction with a tuned cavity or local oscillator is shown, for example, in U.S. Pat. No. 3,792,368. A device and method are taught for tuning the resonant frequency of the microwave cavity of a Maser oscillator to approximately the transition frequency of the stimulated emission of the active medium of the Maser. In this method, the resonant frequency of the microwave cavity is corrected using the error signal obtained by synchronously detecting the phase modulation of the Maser oscillator caused by modulation of the oscillation amplitude. Multiple modulation techniques, however, are not utilized for achieving frequency stability, neither is the cavity detuning detected by inserting a phase modulated probe frequency.

Hydrogen frequency standards, whether active or passive, are based on the F=1, MF=0 to F=0, MF=0 hyperfine transition at 1420 MHz in the ground state of atomic hydrogen. In the typical active type of hydrogen Maser, wherein no microwave signal is injected into the cavity, various parameters are adjusted, such as hydrogen beam intensity, storage time, cavity Q, etc., so that the energy radiated by the hydrogen atoms can be made to exceed cavity losses, and the system breaks into oscillation. The weak signal produced (about $10^{12}$ to $10^{14}$ W) is then phase compared with a local oscillator using multiplication and heterodyne techniques in order to preserve a signal-to-noise ratio. The output of the phase comparator is then used to phase lock the local oscillator to the hydrogen signal. However, while these reference sources are very accurate, they are also very expensive and have a high rate of failure and are subject to a limited lifetime. Thus, the insertion of Maser clocks into each base station of a communications system would be impractical and very expensive.

The first generation of digital radio base stations for GSM were designed to compensate for the drift of internal crystal oscillators by always extracting a reference timing source from the terrestrial transmission network, to which the oscillators could be locked. With the adoption of new transmission technologies and expansion of the GSM technology into personal communication systems such as PCS 1900, the terrestrial transmission network cannot always be trusted as the only reference source for the timing system of the radio base station. The design of some radio base stations took this into consideration and adopted as an alternative to the transport network, an internal frequency source by selecting an exceptionally stable oven controlled crystal oscillator (OCXO) as a free running source. The oscillators used have very good frequency drift characteristics, on the order of a $\Delta f/f \leqq 1\times10^{-8}$ per annum. However, in spite of the excellent characteristics of the oscillator, these sources do require that the radio base station be calibrated every second or third year. The calibration process involves a visit to the base station site by personnel with the appropriate measurement equipment. As the number of sites grow in the network, the calibration requirement can become a major problem for the network operator. Time spent at each radio base station is also considerable, caused by long integration times when measuring the actual frequency, as a basis for the adjustment.

As another option, frequency sources such as GPS satellites can be used to extract a reference signal to which the internal oscillators of the communications system can be locked onto. However, not all network operators are willing to be subjected to the governmental regulations surrounding such satellite systems. In addition, VLF transmission of timing information can also be used as a reference for an internal oscillator. This requires that a fairly local source be used and there are a large number of frequencies and standards to adopt to if total coverage is to be supported.

Thus, there is a need for a method for adjusting for long term drift in reference oscillators which is independent of the transport network technology and cannot be controlled by governmental agencies.

SUMMARY OF THE DISCLOSURE

It is an object of the present invention to solve the problems cited above with regard to the prior art by using an external source which is generally available and is independent of the transport network technology and cannot be controlled by governmental agencies.

According to an exemplary embodiment of the present invention, a method and apparatus for compensating for long term drift of a reference oscillator is disclosed. First, signals from hydrogen clouds external to the apparatus are received and processed to produce an adjustment signal. Then, the frequency of the reference oscillator is adjusted based upon the adjustment signal.

According to another exemplary embodiment of the present invention, an apparatus for adjusting for long term drift of an internal free running reference source within a communications system is disclosed. Signals received at the apparatus from hydrogen clouds external to the apparatus are amplified and downconverted to an intermediate frequency. The apparatus then determines a received signal strength indication signal from the received signals to determine the power of noise signals. Once the Doppler spectrum midpoint of the received signals has been determined using the received signal strength indication signals, an energy peak from the noise can be determined. The frequency of the reference sources can then be adjusted based upon the energy peak of the noise.

According to another exemplary embodiment of the present invention, a method for providing frequency synchronization between a plurality of communication units using a common frequency source in a total distributed system is disclosed. First, signals produced by hydrogen clouds are received by the communication units. Received signal strength indication signals are determined from the received signals and a spectrum map of the received signal strength indication signals is built. A Doppler spectrum midpoint of said received signals is then estimated, and the estimated midpoint frequency is then used as the reference frequency of said distributed system.

According to another exemplary embodiment, a method for correcting oscillator drift in each of a plurality of base stations in a communications system using a frequency reference from cold hydrogen clouds is disclosed.

BRIEF DESCRIPTION OF THE DRAWINGS

These and other features of the invention will be readily apparent to one of ordinary skill in the art from the following written description, used in conjunction with the drawings in which.

DETAILED DESCRIPTION

The present invention is directly applicable to communication base stations, but it is not limited thereto. It will be understood that the present invention can also be used in the clock system of a public telephone switch or any other application where the long term frequency drift of an oscillator must be compensated or corrected.

According to one embodiment of the present invention, the reference frequency used is the frequency radiated by atomic hydrogen when an electron returns from a hyperfine level of its normal state. This frequency is one of the most accurately determined natural constants. Rather than using an internal hydrogen source as is disclosed in hydrogen Maser clocks, the present invention uses the noise produced by cold hydrogen clouds in our galaxy or other galaxies. The hydrogen clouds emit uncorrelated signals from its atoms, with a strong peak at 1,420,405,751.7684 Hz ±0.0017 Hz. This noise, however, is subject to Doppler shift, caused mainly by the rotation of the galaxy and the earth's movement around the sun. The shift varies, with the direction of the observation, up to a maximum of 500 KHz. When the observation is aimed at the center or at the anti-center of the galaxy, all movement is more or less perpendicular to the line of observation. At these points, the Doppler shift is greatly reduced and is on the order of a couple of kilohertz.

Figure 1:
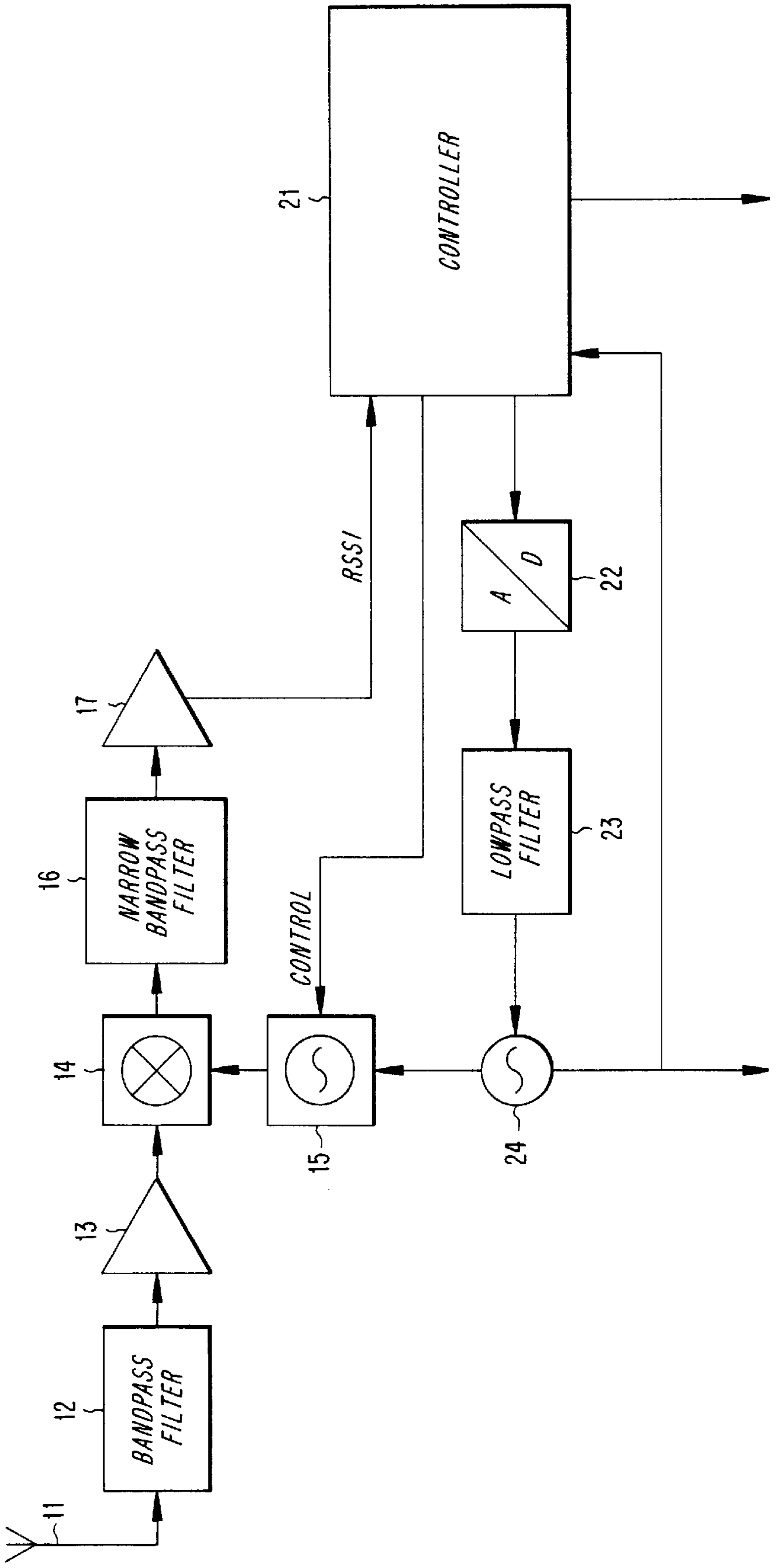
FIG. 1 illustrates a schematic diagram of a compensation system according to one embodiment of the present invention.
Figure 2:
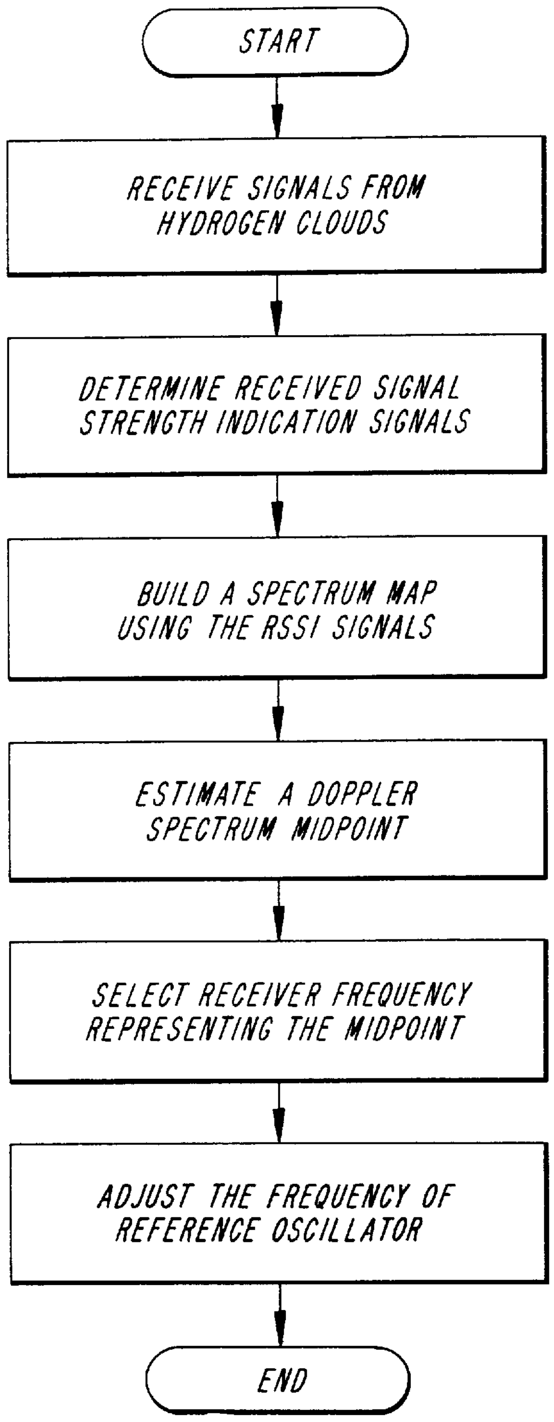
FIG. 2 is a flow chart illustrating the operation of one exemplary embodiment of the present invention.

The present invention will now be described in more detail with reference to FIGS. 1 and 2. The signals from the galaxy are received by an antenna 11 at a base station 10 and are passed to a bandpass filter 12. The antenna 11 includes a low noise amplifier with a noise figure of 0.5 dB directly attached to the receiving element and the amplifier has a gain on the order of 25 dB. The antenna 11 has a backlobe attenuation of approximately 40 dB so as to provide a low enough total noise temperature. The antenna 11 is placed at the base station site and is pointed towards the sky. The bandpass filter 12 prevents disturbances from other sources. The received signals are then preamplified in a low noise amplifier 13. The amplified signals are then downconverted to an intermediate frequency by feeding the signals to a mixer 14 where the signals are mixed with the signals from a synthesized local oscillator 15 which is controlled by a controller 21. The intermediate frequency is extracted by the use of a narrow bandpass filter 16 and is then amplified in a logarithmic amplifier 17. The controller 21 monitors a received signal strength indication (RSSI) signal from the logarithmic amplifier 17 to determine the power of the noise level within the received signal. In particular, the synthesized local oscillator 15 is programmed by the controller 21 to search for a frequency between 600 KHz up to 2 MHz off the desired frequency with the lowest RSSI response. This point is reestablished on a regular basis. The level established at this point is used as a reference level or point A when searching for the desired signal. The controller 21 then processes the RSSI values with the synthesized local oscillator 15 positioned at the frequency of reference point A using a discrete Fourier transform analyzing the RSSI spectrum of 70 to 200 Hz to determine the frequency that gives the lowest response. The RSSI spectrum point that gives the lowest response is used as a jumping rate (JR) when trying to detect the actual signal of interest. This procedure eliminates the influence from noise sources such as the AC network or other sources that could disturb the detection process.

By making the synthesized local oscillator 15 jump at a rate between the frequency level of reference A and a frequency of the scanned spectrum and applying a digital filter function to the RSSI signal, a signal can be detected. The jumping procedure prevents gain drift caused by variations in the ambient temperature or the supply voltage of the involved circuits, from disturbing the detection process. As will be described below, the RSSI signal is used to build a spectrum map so that the system can estimate the Doppler spectrum midpoint of the received signals and to detect abnormal signal levels.

Using the detection method described above, the spectrum of the desired signal is swept at intervals determined by the built-in clock in the controller 21. This clock is well correlated with the rotation of the planet. The response from the digitally filtered RSSI signal is recorded for each sweep. Results are collected over a primary measurement period (PMP) which involves on the order of 5 to 10 revolutions of the planet. A weighted geometric midpoint of the sweeps is calculated and recorded.

The Y-axis (level) of the geometric midpoint estimation is non-linear, giving more weight to levels above a threshold. The X-axis is the frequency axis which is linear. The frequency of the geometric midpoint is related to the frequency of the internal reference oscillator. The frequency is the result of the primary measurement period. Previous results are discarded as new results are established in a first-in/first-out fashion. The results from a number of primary measurement periods are collected and an average is calculated to be used for the correction of the internal frequency oscillator 24. The estimate of the midpoint of the Doppler spectrum is determined by continuously scanning the spectrum between its theoretical outskirts in a manner described below.

The noise energy at a large number of closely spaced frequencies of the scanned spectrum are compared with the average energy of a number of frequencies allocated close to the spectrum of interest. This process allows a spectrum map to be created even for relatively small distances in noise power by cancelling out gain variations of the receiver. The spectrum map can be updated every couple of minutes on a twenty-four hour schedule. The time correlation will aid in the selection of the appropriate times of the day for the next step of the process. The frequency of the spectrum is established by deriving it from the local oscillator frequency representing the midpoint.

The controller 21 acts upon the frequency representing the midpoint with an averaging algorithm and filter function, by adjusting the control value of a D/A converter 22. The controller 21 evaluates the results from the primary measurement periods and establishes a new value for the control voltage of the internal OCXO reference oscillator 24 when necessary. If the measured average frequency appears to be too high or too low, the internal OCXO reference oscillator 24 is adjusted to accommodate 1/e of the detected frequency error, if the error is greater than the temporary drift acceptance criteria and is smaller than the large drift error criteria. If the detected frequency error is large, a counter is incremented and the error value is saved, but no adjustment is made. If the counter reaches a value of 5 and the error values are consistent, a correction is made. Furthermore, multiple large corrections which immediately follow each other raise an alarm. On the other hand, very small errors that are within a drift acceptance criteria are allowed to accumulate before a correction is done to the internal OCXO reference oscillator control signal. The output of the D/A converter 22 is a control voltage which is fed, via a lowpass filter 23 to a frequency adjust input of the internal frequency oscillator 24. The frequency of the internal oscillator 24 is then long termed frequency locked to the hydrogen noise present in the galaxy. The output of the reference oscillator 24 is the desired output signal of the system and can also be used as a reference to the synthesized local oscillator 15 as well as all internal timing within the present invention.

In another embodiment of the present invention, an alternative approach to RSSI is described. Instead of using a logarithmic amplifier 17, the system can use an adjustable gain amplifier 30, controlled by the controller 21 and followed by an RMS detector 32 to obtain the same result. The gain is adjusted by the controller to adapt to the received signal level. The RMS detector 32 has a lower dynamic range and adjustable gain will be necessary to safely detect strong interfering signals, if they occur.

According to another exemplary embodiment of the invention, an absolute frequency reference from cold hydrogen clouds can be used as a frequency reference between mobile units using or depending on a common frequency source. For example, the present invention can be used in voice or data communications between aircraft or in airborne Synthetic Aperture Radar systems. In such systems, the long term averaging process described above is not needed. Instead, the spectrum midpoint as established above is immediately used as the reference frequency of the total distributed system. Each of the mobile units are individually establishing the spectrum midpoint and can thus use the spectrum midpoint to be in frequency sync with each other. Since the midpoint is reestablished at regular intervals by all involved units, the whole system of mobile units will be frequency locked.

Figure 3:
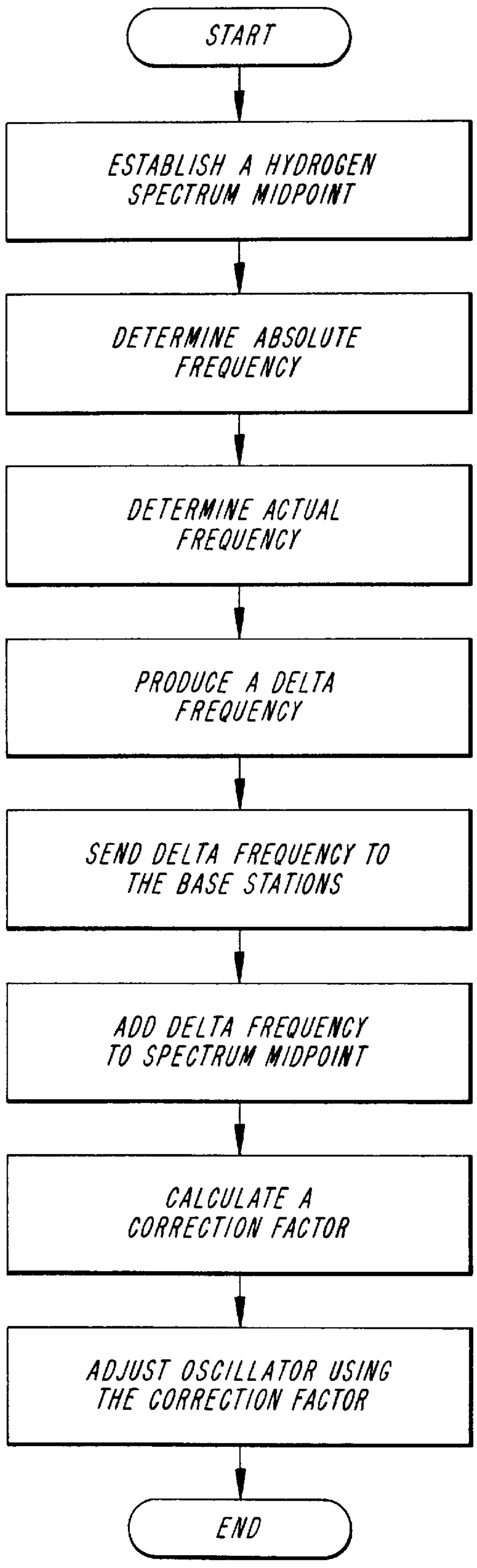
FIG. 3 is a flow chart illustrating the operation of one exemplary embodiment of the present invention.

According to another exemplary embodiment of the invention, an absolute frequency reference from cold hydrogen clouds can be used in frequency stamp distributed systems as illustrated in FIG. 3. The following example refers to a GSM based system but the invention is not limited thereto. A system of subordinate units, for example radio base stations, can be equipped to establish the hydrogen spectrum midpoint using the method described above or can receive the information from nodes higher in the network hierarchy, such as a mobile station controller. The absolute frequency of the established midpoint is determined with a very accurate clock as a reference. The determined frequency is subtracted from the actual frequency normally emitted at the hyperfine transition of the hydrogen electron. The difference is a delta frequency, which represents the frequency deviation caused by the doppler shift. The information about the delta frequency is regularly reevaluated. The delta frequency is distributed to the radio base stations by placing the information into a message on the operation and maintenance links. In GSM, operation and maintenance messages are sent over the A-bis interface using a specific SAPI value, for example 62, on the LAPD connections between the BSC and the radio base stations. According to this embodiment, a new message is introduced at layer 3 (OSI model reference) and is sent over the operation and maintenance link. This message carries information about the delta frequency to the radio base station central timing function. The delta frequency is then added to the spectrum midpoint established at the radio base station. The actual frequency of the hydrogen line is subtracted from the result, giving a difference, which indicates how the oscillator in the radio base station should be adjusted, After an integration process over a number of difference values, a correction is applied to the oscillator. The number of samples processed by the integration process, before acting to correct aging drift, should be determined by the drift characteristics of the oscillator. A correction is made within a time frame, specified by the oscillator manufacturer as giving a maximum of a fourth of the allowed aging drift under the given operating conditions.

The delay in distribution of the delta frequency messages is not critical since the spectrum midpoint information is very stable in its nature. However, if the corrections would make reference to time rather than frequency, the variations in time delay introduced by the actual network between the radio base stations and the BSC would be affecting the correction process. Time stamp systems are vulnerable to variations in time of the information distribution, while frequency stamp systems are not, provided that the frequency variation of the involved source are not abrupt.

It will be appreciated by those of ordinary skill in the art that the present invention can be embodied in other specific forms without departing from the spirit or essential character thereof. The present disclosed embodiments are therefore considered in all respects to be illustrative and not restrictive. The scope of the invention is indicated by the appended claims rather than the forgoing description, and all changes which come within the meaning and range of equivalents thereof are intended to be embraced therein.

We claim:

1. An apparatus for adjusting for long term drift of an internal free running reference source, comprising:

means for receiving signals from hydrogen clouds external to said apparatus;

means for processing said received signals to produce an adjustment signal; and means for adjusting the frequency of said reference source based upon said adjustment signal.

2. An apparatus according to claim 1, wherein said reference source is in a base station in a communications system.

3. A method for compensating for long term drift of a reference oscillator located within communications equipment, comprising the steps of:

receiving signals from hydrogen clouds external to said equipment;

processing said received signals to produce an adjustment signal; and adjusting the frequency of said reference oscillator based upon said adjustment signal.

4. An apparatus for adjusting for long term drift of an internal free running reference source, comprising:

means for receiving signals from hydrogen clouds external to said apparatus;

means for amplifying said received signals;

means for downconverting said amplified signals to an intermediate frequency;

means for filtering and amplifying the downconverted signals;

means for determining a received signal strength indication signal from said filtered and amplified signals to determine the power of noise signals;

means for estimating a Doppler spectrum midpoint of said received signals using said received signal strength indication signals; and means for adjusting the frequency of said reference source based upon said Doppler spectrum midpoint.

5. A method for compensating for long term drift of a reference oscillator, comprising the steps of:

receiving signals produced by hydrogen clouds;

determining received signal strength indication signals from said received signals;

building a spectrum map of said received signal strength indication signals;

estimating a Doppler spectrum midpoint of said received signals; and adjusting the frequency of said reference oscillator based upon said Doppler spectrum midpoint.

6. A method for providing frequency synchronization between a plurality of communication units using a common frequency source in a distributed system, comprising the steps of:

receiving signals produced by hydrogen clouds;

determining received signal strength indication signals from said received signals;

building a spectrum map of said received signal strength indication signals;

estimating a Doppler spectrum midpoint of said received signals; and using said Doppler spectrum midpoint frequency as the reference frequency of said distributed system.

7. A method according to claim 6, wherein the midpoint frequency is reestablished at regular intervals.

8. A method for correcting oscillator drift in a base station in a communications system using a frequency reference from cold hydrogen clouds, comprising the steps of:

establishing a hydrogen spectrum midpoint at a central unit;

determining an absolute frequency of the midpoint frequency;

producing a delta frequency by subtracting the absolute frequency from a known actual frequency of hydrogen transition;

sending said delta frequency to said base station adding the delta frequency to a spectrum midpoint established at the base station to produce a resulting frequency;

subtracting actual frequency of the hydrogen line from said resulting frequency to produce a correction factor; and adjusting an oscillator at the base station using said correction factor.

9. A method ac cording to claim 8, wherein said delta frequency is regularly reevaluated.

10. A method according to claim 8, wherein said delta frequency is sent to said base stations using an operation and maintenance link.

11. A method according to claim 8, further comprising the steps of:

integrating a plurality of correction factors at the base station to produce an integrated correction factor; and adjusting said oscillator at the base station using said integrated correction factor.

* * * * *